United States Patent
Lee et al.

(10) Patent No.: US 6,858,371 B2
(45) Date of Patent: Feb. 22, 2005

(54) MALEIMIDE-PHOTORESIST MONOMERS CONTAINING HALOGEN, POLYMERS THEREOF AND PHOTORESIST COMPOSITIONS COMPRISING THE SAME

(75) Inventors: Geun Su Lee, Kyoungki-do (KR); Jae Chang Jung, Kyoungki-do (KR); Min Ho Jung, Kyoungki-do (KR); Cha Won Koh, Seoul (KR); Ki Soo Shin, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 117 days.

(21) Appl. No.: 10/080,335

(22) Filed: Feb. 21, 2002

(65) Prior Publication Data

US 2003/0013037 A1 Jan. 16, 2003

(30) Foreign Application Priority Data

Apr. 13, 2001 (KR) .......................... 2001-19815
Apr. 13, 2001 (KR) .......................... 2001-19816

(51) Int. Cl.$^7$ .......................... G03F 7/004; C08F 26/06
(52) U.S. Cl. .................. 430/270.1; 430/905; 430/907; 526/242; 526/262; 526/281
(58) Field of Search .................. 430/270.1, 325, 430/905, 907; 526/242, 262, 281

(56) References Cited

U.S. PATENT DOCUMENTS 3,658,843 A * 4/1972 Kleiner .................. 548/548
5,059,513 A * 10/1991 Hopf et al. ............. 430/326
5,558,978 A * 9/1996 Schadeli et al. ........ 430/270.1
6,316,565 B1 * 11/2001 Jung et al. .............. 526/262
6,406,828 B1 * 6/2002 Szmanda et al. ........ 430/270.1

FOREIGN PATENT DOCUMENTS

JP        07207021        * 8/1995

* cited by examiner

*Primary Examiner*—Rosemary Ashton
(74) *Attorney, Agent, or Firm*—Marshall, Gerstein & Borun LLP

(57) ABSTRACT

Photoresist monomers, photoresist polymers prepared thereof, and photoresist compositions using the polymer are disclosed. More specifically, photoresist polymers comprising maleimide monomer represented by Formula 1, and a composition comprising the polymer thereof are disclosed. The photoresist composition has excellent etching resistance, heat resistance and adhesiveness, and can be developed in an aqueous tetramethylammonium hydroxide (TMAH) solution. As the composition has low light absorbance at 193 nm and 157 nm wavelength, and it is suitable for a process using ultraviolet light source such as VUV (157 nm)

Formula 1

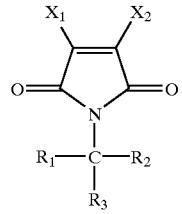

wherein, $X_1$, $X_2$, $R_1$, $R_2$ and $R_3$ are defined in the specification.

21 Claims, 8 Drawing Sheets

MALEIMIDE-PHOTORESIST MONOMERS CONTAINING HALOGEN, POLYMERS THEREOF AND PHOTORESIST COMPOSITIONS COMPRISING THE SAME

BACKGROUND

1. Technical Field

Novel photoresist monomers, polymers thereof and photoresist compositions containing the same are it disclosed. In particular, photoresist polymers suitable for a photolithography process using DUV (deep ultraviolet) light source, such as VUV (157 nm) in fabricating a minute circuit for a highly integrated semiconductor device, photoresist compositions containing the same, and preparation process therefore are disclosed.

2. Description of the Related Art

A photoresist for an ArF and VUV (vacuum ultraviolet) should have low absorbency of 193 nm and 157 nm wavelengths, excellent etching resistance and adhesiveness on a substrate, and development ability in a commercially available developing solution, such as aqueous tetramethylammonium hydroxide (TMAH) solutions of 2.38 wt % or 2.6 wt %.

Much research has been conducted on resins having a high transparency at 193 nm and etching resistance similar to Novolac resins. However, most of the resists are not suitable resist for VUV due to their high absorbency at 157 nm wavelength. Also, research has been conducted on photoresists containing fluorine and silicon to solve the above problem. However, most polyethylene, polystyrene or polyacrylate polymers containing fluorine have weak etching resistance, low solubility in commercially available aqueous TMAH solutions and poor adhesiveness to the silicon wafer. In addition, these photoresists are difficult to mass-produce and are expensive.

SUMMARY OF THE DISCLOSURE

Photoresist monomers comprising maleimide substituted with fluorine are disclosed.

Photoresist polymers containing the above photoresist monomers are also disclosed.

Photoresist compositions containing the photoresist polymers described above and processes for forming photoresist patterns are also disclosed.

Semiconductor elements produced using the photoresist compositions described above are also disclosed.

DETAILED DESCRIPTION OF THE PRESENTLY PREFERRED EMBODIMENTS

Figure 1:
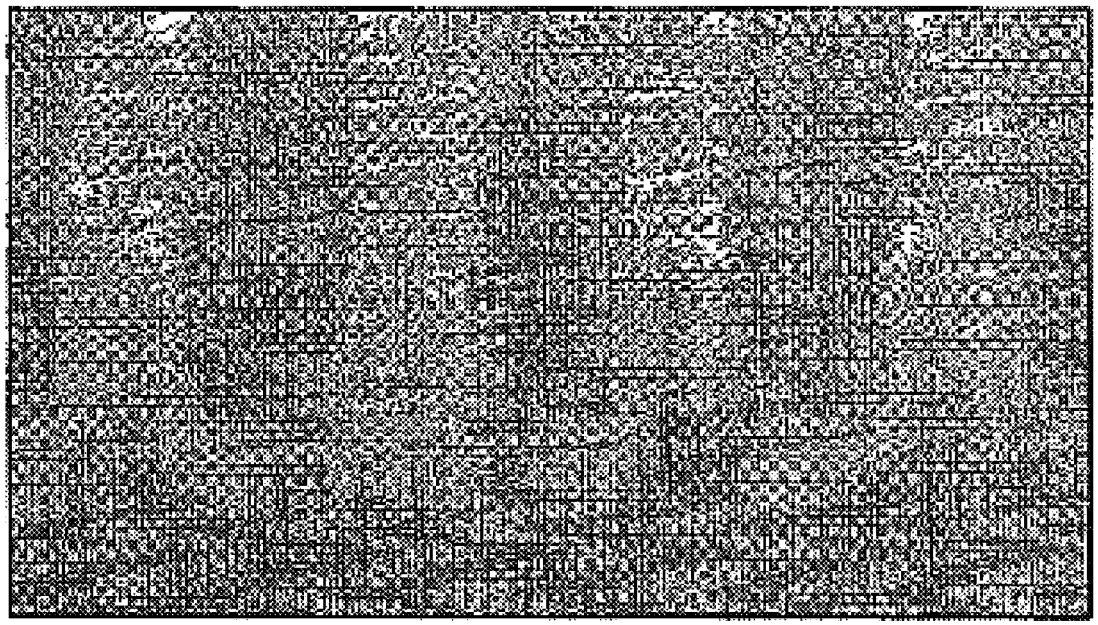
FIG. 1 is a photograph showing a pattern obtained in Example 9.

Photoresist monomers of the present invention are represented by following Formula 1:

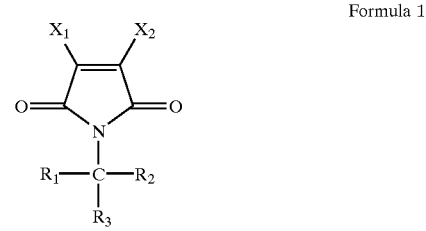

Formula 1 wherein, $X_1$ and $X_2$ are H, $CF_3$ or halogen; and $R_1$, $R_2$ and $R_3$ individually represent H, F, $CF_3$, OH, ($C_1$–$C_{10}$) alkyl group, ($C_1$–$C_{10}$) perfluoroalkyl group or ($C_1$–$C_{10}$) alkoxy group.

As a preferable example of the monomer represented by Formula 1 is N-perfluoropropyl maleimide or N-perfluorooctyl maleimide.

Photoresist repeating units comprise the monomer represented by Formula 1 and at least one photoresist copolymer comprising repeating unit thereof.

The copolymer may further comprise the compound represented by following co-monomer of Formula 2.

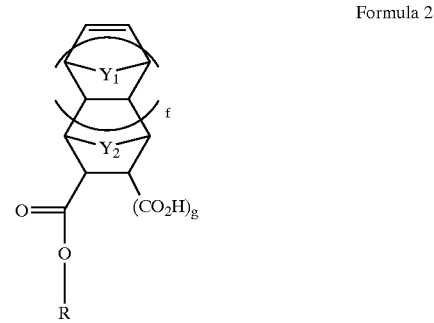

Formula 2 wherein, $Y_1$, and $Y_2$ are O, $CH_2$ or $CH_2CH_2$; R is an acid labile protecting group or

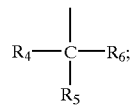

$R_4$, $R_5$ and $R_6$ individually represent H, F, $CF_3$, OH, ($C_1$–$C_{10}$) alkyl group, ($C_1$–$C_{10}$) perfluoroalkyl group or ($C_1$–$C_{10}$) alkoxy group; and f and g are 0 or 1.

The acid labile protecting group is the one that can be released by acid, which prevent the compound from dissolving in an alkaline developing solution. When some of conventional acid labile protecting group is bounded to polymer, the dissolution of photoresist material by alkaline developing solution is inhibited, while, in case that the acid labile protecting group is released by acid generated by light exposure, the photoresist material can be dissolved in developing solution. As the acid labile protecting group, any groups that can serve such a role may be used; the groups include what are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,225,020 B1 (May 1, 2001), U.S. Pat. No. 6,235,448 B1 (May 22, 2001) and U.S. Pat. No. 6,235,447 B1 (May 22, 2001). Preferred acid labile protecting groups are selected from the group consisting of t-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, t-butoxyethyl, 1-isobutoxyethyl and 2-acetylmenth-1-yl.

In addition, the copolymer of the prevent invention may further comprise at least one of the compound represented by following Formula 3 and Formula 4:

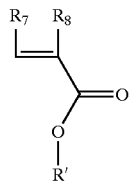

Formula 3

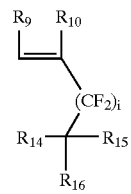

Formula 4 wherein, R' is an acid labile protecting group or

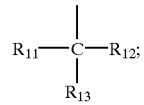

$R_{11}$, $R_{12}$ and $R_{13}$ individually represent H, F, $CF_3$, OH, ($C_1$–$C_{10}$) alkyl group, ($C_1$–$C_{10}$) perfluoroalkyl group or ($C_1$–$C_{10}$) alkoxy group; $R_7$, $R_8$, $R_9$ and $R_{10}$ individually represent H, F, $CF_3$ or $CH_3$; $R_{14}$, $R_{15}$ and $R_{16}$ individually represent H, F, $CF_3$, OH, ($C_1$–$C_{10}$) alkyl group, ($C_1$–$C_{10}$) perfluoroalkyl group or ($C_1$–$C_{10}$) alkoxy group, wherein, at least one of $R_{14}$, $R_{15}$ and $R_{16}$ are F, $CF_3$ or ($C_1$–$C_{10}$) perfluoroalkyl group; and i is an integer ranging from 0 to 10.

In addition, the photoresist polymers may further comprise the compound of following Formula 5.

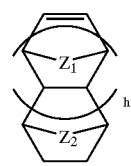

Formula 5 wherein, $Z_1$ and $Z_2$ are O, $CH_2$ or $CH_2CH_2$; and h is 0 or 1.

Preferably, the repeating unit of the present invention is represented by following Formula 6.

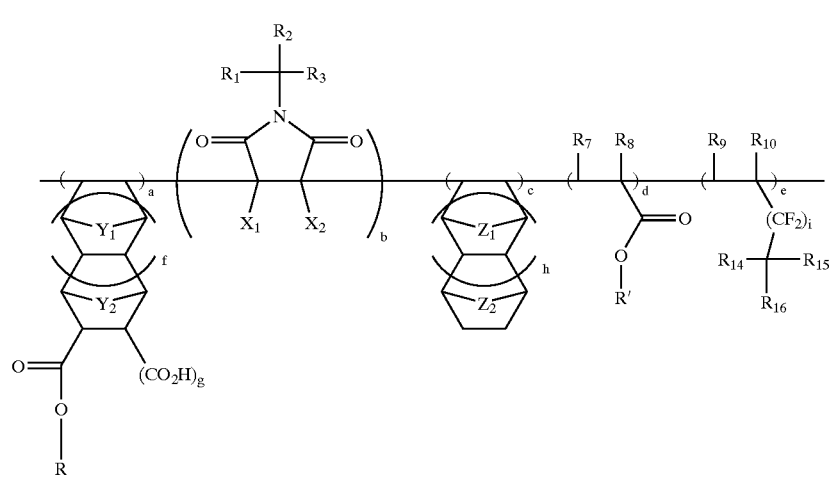

Formula 6 wherein, $X_1$ and $X_2$ are H, $CF_3$ or halogen; $Y_1, Y_2, Z_1$ and $Z_2$ are O, $CH_2$ or $CH_2CH_2$; $R_1$, $R_2$ and $R_3$ individually represent H, F, $CF_3$, OH, ($C_1$–$C_{10}$) alkyl group, ($C_1$–$C_{10}$) perfluoroalkyl group, or ($C_1$–$C_{10}$) alkoxy group; R is an acid labile protecting group or

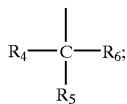

R' is an acid labile protecting group or

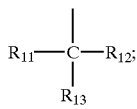

$R_4$, $R_5$, $R_6$, $R_{11}$, $R_{12}$ and $R_{13}$ individually represent H, F, $CF_3$, OH, ($C_1$–$C_{10}$) alkyl group, ($C_1$–$C_{10}$) perfluoroalkyl group or ($C_1$–$C_{10}$) alkoxy group; $R_7$, $R_8$, $R_9$ and $R_{10}$ are H, F, $CF_3$ or $CH_3$; $R_{14}$, $R_{15}$ and $R_{16}$ individually represent H, F, $CF_3$, OH, ($C_1$–$C_{10}$) alkyl group, ($C_1$–$C_{10}$) perfluoroalkyl group or ($C_1$–$C_{10}$) alkoxy group, wherein, at one least of the $R_{14}$, $R_{15}$ and $R_{16}$ are F, $CF_3$ or ($C_1$–$C_{10}$) perfluoroalkyl group; f and g are 0 or 1; i is an integer ranging from 0 to 10; the ratio a:b:c:d:e is 0–50 mol %:40–60 mol %:0–30 mol %:0–30 mol %:0–50 mol %; and preferably 1–50 mol %:40–60 mol %:0–30 mol %:0–30 mol %:0–50 mol %.

Preferable examples of the above repeating unit of Formula 6 include:

poly(N-perfluoropropyl maleimide/t-butyl-5-norbornene-2-carboxylate);
poly(N-perfluoropropyl maleimide/t-butyl-5-norbornene-2-carboxylate/norbornylene);
poly(N-perfluorooctyl maleimide/t-butyl-5-norbornene-2-carboxylate);
poly(N-perfluorooctyl maleimide/t-butyl-5-norbornene-2-carboxylate/norbornylene);
poly[N-perfluoropropyl maleimide/t-butyl-5-norbornene-2-carboxylate/2-(perfluorooctyl)ethyl methacrylate);
poly(N-perfluoropropyl maleimide/t-butyl-5-norbornene-2-carboxylate/2,2,4,4,5,5,6,6,6-nonafluorohexyl methacrylate);
poly(N-perfluorooctyl maleimide/t-butyl-5-norbornene-2-carboxylate/3,3,4,4,5,5,6,6,6-nonafluoro-1-hexene); and
poly(N-perfluorooctyl maleimide/norbornylene/t-butyl-5-norbornene-2-carboxylate/4,4,5,5,6,6,7,7,7-nonafluoro-2-hydroxyheptyl acrylate).

The polymer can be prepared by various methods.

In one preferred method, polymers are prepared by a process comprising:

(a) admixing (i) a compound of Formula 1 and (ii) at least one of compounds of Formula 2 to Formula 5; and (b) adding a polymerization initiator into the resultant solution to obtain a repeating unit of Formula 6.

The polymerization may be bulk polymerization, solvent polymerization or metal catalyst polymerization.

The step (a) is preferably carried out in a conventional organic solvent of the solvent polymerization, for example, cyclohexanone, cyclopentanone, tetrahydrofuran, dimethylformamide, dimethylsulfoxide, dioxane, methylethyl ketone, benzene, toluene, propylene glycol methyl ether acetate, xylene and mixtures thereof.

The polymerization initiators can be any conventional one, preferably radical polymerization initiator, for example, benzoylperoxide, 2,2'-azobisisobutylronitrile (AIBN), acetylperoxide, laurylperoxide, t-butylperacetate, t-butylhydroperoxide or di-tert-butylperoxide.

More preferably, after polymerization, the polymers are subject to crystallization and/or purification by using diethyl ether, petroleum ether, hexane, alcohols (methanol, ethanol, isopropanol, and the like), water or mixtures thereof.

Photoresist compositions comprise: (i) a photoresist polymer described above; (ii) a photoacid generator; and (iii) an organic solvent.

Any of known photoacid generator, which is able to generate acids by light, can be used in photoresist composition of present invention. conventional photoacid generators are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001).

Preferred photoacid generators include sulfide or onium type compound. Specifically, photoacid generators are selected from the group consisting of phthalimidotrifluoromethanesulfonate, dinitrobenzyl tosylate, n-decyldisulfone and naphthylimidotrifluoromethanesulfonate, which have relatively low absorbance at 157 nm and 193 nm. Together with the compounds, photoacid generators are selected from the group consisting of diphenyliodide hexafluorophosphate, diphenyliodide hexafluoroarsenate, diphenyliodide hexafluoroantimonate, diphenyl-p-methoxyphenylsulfonium triflate, diphenyl-p-toluenylsulfonium triflate, diphenyl-p-isobutylphenylsulfonium triflate, triphenylsulfonium hexafluoroarsenate, triphenylsulfonium hexafluoroantimonate, triphenylsulfonium triflate and dibutylnaphthylsulfonium triflate may be used.

The photoacid generator is used in an amount ranging from about 0.05 to about 10 wt % of the photoresist polymer employed. It has been found that when the photoacid generator is used in the amount less than 0.05 wt %, it lowers photosensitivity of the photoresist composition, and when the photoacid generator is used in the amount of greater than about 10 wt %, it results in poor pattern formation due to its high absorption of DUV.

Organic solvent can be any of known solvent disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). Preferable organic solvents in photoresist compositions of the present invention include methyl 3-methoxy propionate, ethyl 3-ethoxypropionate, propyleneglycol methyl ether acetate, cyclohexanone, 2-heptanone, ethyl lactate, diethyleneglycol diethyl ether or mixture thereof is preferably used.

The amount of solvent used is preferably in the range of from about 500 to about 2000 wt % by weight of the photoresist polymer. This ratio has been found to be particularly useful for obtaining a photoresist layer of a desirable thickness.

In particular, it has been found by the weight of the photoresist copolymer, a photoresist layer having about 0.25 μm of thickness can be obtained.

A process for forming a photoresist pattern comprises:

(a) coating the photoresist composition described above on a substrate to form a photoresist film;

(b) exposing the photoresist film to light; and (c) developing the photoresist film.

The process for forming the photoresist pattern can further include a soft baking step which is performed before the step (b) and/or a post baking step which is performed after the step (b). Preferably, the soft and post baking steps are performed at the temperature in the range from about 70 to about 200° C.

Exemplary light sources which are useful for forming the photoresist pattern include ArF, KrF, VUV, EUV, E-beam, X-line or ion beam. Preferably, the irradiation energy is in the step (b) is in the range from about 1 mJ/cm$^2$ to about 100 mJ/cm$^2$.

I. Preparation of Photoresist Polymers

EXAMPLE 1

Synthesis of Poly(N-perfluoropropyl maleimide/t-butyl-5-norbornene-2-carboxylate)

To 25 mL of tetrahydrofuran was added 100 mmole of N-perfluoropropyl maleimide, 55 mmole of t-butyl-5-norbornene-2-carboxylate and 0.3 g AIBN, and the resulting solution was reacted at about 65° C. for about 6 hours.

Thereafter, a polymer was precipitated and filtered in diethyl ether or diethyl ether/petroleum ether solution, thereby obtaining the polymer. (yield: 32%)

EXAMPLE 2

Synthesis of Poly(N-perfluoropropyl maleimide/t-butyl-5-horbornene-2-carboxylate/nobornylene)

To 25 mL of tetrahydrofuran was added 100 mmole of N-perfluoropropyl maleimide, 30 mmole of norbonylele, 70 mmole of t-butyl-5-norbornene-2-carboxylate, and 0.3 g AIBN, and the resulting solution was reacted at about 65° C. for about 6 hours.

Thereafter, a polymer was precipitated and filtered in diethyl ether or diethyl ether/petroleum ether solution, thereby obtaining the polymer. (yield: 31%)

EXAMPLE 3

Synthesis of Poly(N-perfluorooctyl maleimide/t-butyl-5-norbornene-2-carboxylate)

To 25 mL of tetrahydrofuran was added 100 mmole of N-perfluorooctyl maleimide, 55 mmole of t-butyl-5-norbornene-2-carboxylate and 0.3 g AIBN, and the resulting solution was reacted at about 65° C. for about 6 hours.

Thereafter, a polymer was precipitated and filtered in diethyl ether or diethyl ether/petroleum ether solution and dried in vacuo to obtain title compound. (yield: 32%)

EXAMPLE 4

Synthesis of Poly(N-perfluorooctyl maleimide/t-butyl-5-norbornene-2-carboxylate/norbornylene)

To 25 mL of tetrahydrofuran was added 100 mmole of perfluorooctyl maleimide, 30 mmole of norbornylene, 70 mmole of t-butyl-5-norbornene-2-carboxylate and 0.32 g AIBN, and the resulting solution was reacted at about 65° C. for about 6 hours.

Thereafter, a polymer was precipitated and filtered in diethyl ether or diethyl ether/petroleum ether solution and dried in vacuo to obtain title compound. (yield: 31%)

EXAMPLE 5

Synthesis of Poly[N-perfluoropropyl maleimide/t-butyl-5-norbornene-2-carboxylate/2-(perfluorooctyl) ethyl methacrylate)

To 25 mL of tetrahydrofuran was added 100 mmole of N-perfluoropropyl maleimide, 100 mmole of t-butyl-5-norbornene-2-carboxylate, 10 mmole of 2-(perfluorooctyl) ethyl methacrylate and 0.3 g AIBN, and the resulting solution was reacted at about 65° C. for about 6 hours.

Thereafter, a polymer was precipitated and filtered in diethyl ether or diethyl ether/petroleum ether solution, thereby obtaining the polymer. (yield: 35%)

EXAMPLE 6

Synthesis of Poly(N-perfluoropropyl maleimide/t-butyl-5-norbornene-2-carboxylate/3,3,4,4,5,5,6,6,6-nonafluorohexyl methacrylate)

To 25 mL of tetrahydrofuran was added 100 mmole of N-perfluoropropyl maleimide, 100 mmole of t-butyl-5-norbornene-2-carboxylate, 30 mmole of 3,3,4,4,5,5,6,6,6-nonafluorohexyl methacrylate and 0.3 g AIBN, and the resulting solution was reacted at about 65° C. for about 6 hours.

Thereafter, a polymer was precipitated and filtered in diethyl ether or diethyl ether/petroleum ether solution and dried in vacuo to obtain title compound. (yield: 36%)

EXAMPLE 7

Synthesis of Poly(N-perfluorooctyl maleimide/t-butyl-5-norbornene-2-carboxylate/3,3,4,4,5,5,6,6,6-nonafluoro-1-hexene)

To 25 mL of tetrahydrofuran was added 100 mmole of perfluorooctyl maleimide, 100 mmole of t-butyl-5-norbornene-2-carboxylate, 40 mmole of 3,3,4,4,5,5,6,6,6-nonafluoro-1-hexene and 0.3 g AIBN, and the resulting solution was reacted at about 65° C. for about 6 hours.

Thereafter, a polymer was precipitated and filtered in diethyl ether or diethyl ether/petroleum ether solution and dried in vacuo to obtain title compound. (yield: 33%)

EXAMPLE 8

Synthesis of Poly(N-perfluorooctyl maleimide/ norbornylene/t-butyl-5-norbornene-2-carboxylate/4, 4,5,5,6,6,7,7,7-nonafluoro-2-hydroxyheptyl acrylate)

To 25 mL of tetrahydrofuran was added 100 mmole of perfluorooctyl maleimide, 10 mmole of norbornylene, 90 mmole of t-butyl-5-norbornene-2-carboxylate, 40 mmole of 4,4,5,5,6,6,7,7,7-nonafluoro-2-hydroxyheptyl acrylate and 0.3 g AIBN, and the resulting solution was reacted at about 65° C. for about 6 hours.

Thereafter, a polymer was precipitated and filtered in diethyl ether or diethyl ether/petroleum ether solution and dried in vacuo to obtain title compound. (yield: 34%)

II. Preparation of Photoresist Composition and Formation of Patterns

EXAMPLE 9

To 100 g of propylene glycol methyl ethyl acetate (PGMEA) was added 10 g of the polymer of Example 1, 0.06 g of phthalimidotrifluoromethane sulfonate, and 0.06 g of triphenylsulfonium triflate. The resulting solution was filtered through 0.20 μm filter to obtain a photoresist composition.

The photoresist composition thus prepared was spin-coated on silicon wafer to form a photoresist film, and soft-baked in an oven or hot plate of about 110° C. for about 90 seconds. After baking, the photoresist was exposed to light using a ArF laser exposer, and then post-baked at about 110° C. for about 90 seconds. When the post-baking was completed, it was developed in 2.38 wt % aqueous TMAH solution for about 40 seconds, to obtain 0.12 μm L/S pattern (see FIG. 1).

EXAMPLE 10

To 100 g of propylene glycol methyl ethyl acetate (PGMEA) was added 10 g of the polymer of Example 2, 0.06 g of phthalimidotrifluoromethane sulfonate, and 0.06 g of triphenylsulfonium triflate. The resulting solution was filtered through 0.20 μm filter to obtain a photoresist composition.

Figure 2:
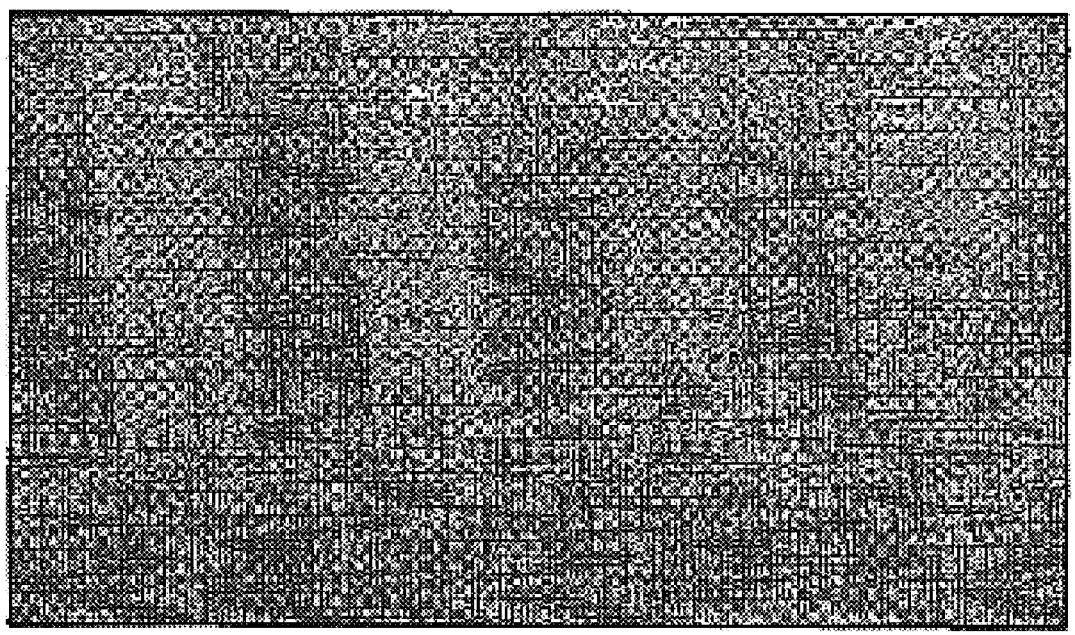
FIG. 2 is a photograph showing a pattern obtained in Example 10.

The photoresist composition thus prepared was spin-coated on silicon wafer to form a photoresist film, and soft-baked in an oven or hot plate of about 110° C. for about 90 seconds. After baking, the photoresist was exposed to light using a ArF laser exposer, and then post-baked at about 110° C. for about 90 seconds. When the post-baking was completed, it was developed in 2.38 wt % aqueous TMAH solution for about 40 seconds, to obtain 0.12 μm L/S pattern (see FIG. 2).

EXAMPLE 11

To 100 g of propylene glycol methyl ethyl acetate (PGMEA) was added 10 g of the polymer of Example 3, 0.06 g of phthalimidotrifluoromethane sulfonate, and 0.06 g of triphenylsulfonium triflate. The resulting solution was filtered through 0.20 μm filter to obtain a by photoresist composition.

Figure 3:
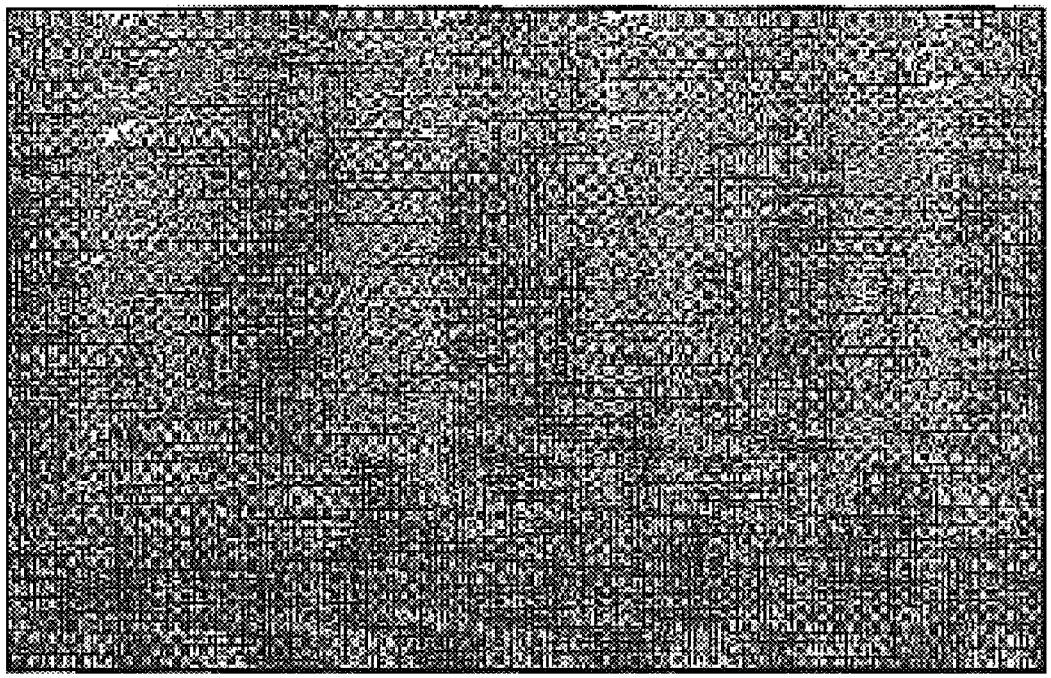
FIG. 3 is a photograph showing a pattern obtained in Example 11.

The photoresist composition thus prepared was spin-coated on silicon wafer to form a photoresist film, and soft-baked in an oven or hot plate of about 110° C. for about 90 seconds. After baking, the photoresist was exposed to light using a ArF laser exposer, and then post-baked at about 110° C. for about 90 seconds. When the post-baking was completed, it was developed in 2.38 wt % aqueous TMAH solution for about 40 seconds, to obtain 0.12 μm L/S pattern (see FIG. 3).

EXAMPLE 12

To 100 g of propylene glycol methyl ethyl acetate (PGMEA) was added 10 g of the polymer of Example 4, 0.06 g of phthalimidotrifluoromethane sulfonate, and 0.06 g of triphenylsulfonium triflate. The resulting solution was filtered through 0.20 μm filter to obtain a photoresist composition.

Figure 4:
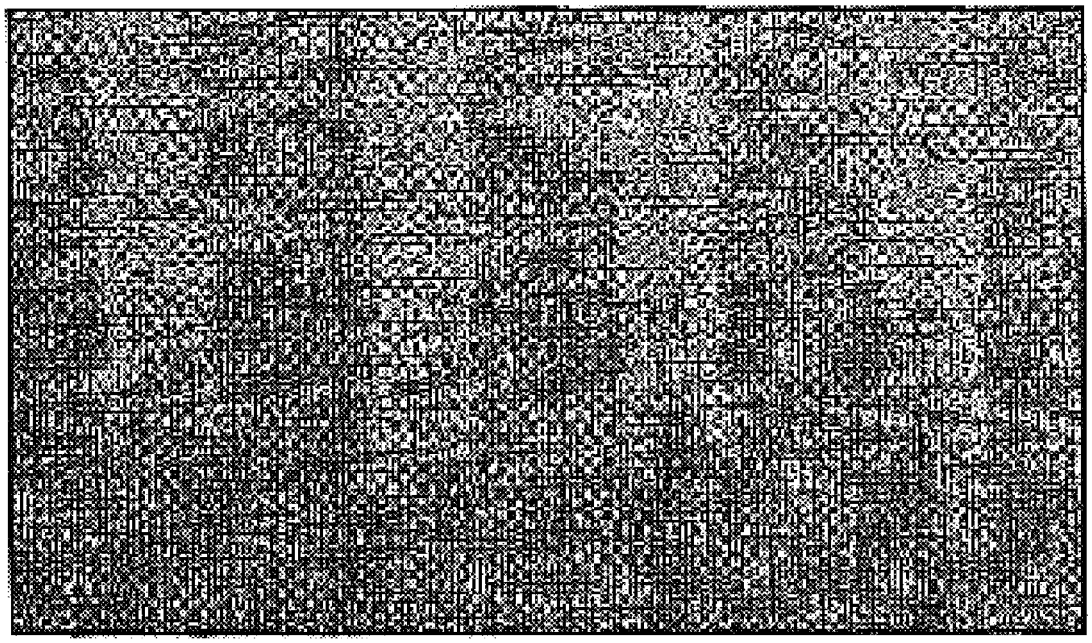
FIG. 4 is a photograph showing a pattern obtained in Example 12.

The photoresist composition thus prepared was spin-coated on silicon wafer to form a photoresist film, and soft-baked in an oven or hot plate of about 110° C. for about 90 seconds. After baking, the photoresist was exposed to light using a ArF laser exposer, and then post-baked at about 110° C. for about 90 seconds. When the post-baking was completed, it was developed in 2.38 wt % aqueous TMAH solution for about 40 seconds, to obtain 0.12 μm L/S pattern (see FIG. 4).

EXAMPLE 13

To 100 g of propylene glycol methyl ethyl acetate (PGMEA) was added 10 g of the polymer of Example 5, 0.06 g of phthalimidotrifluoromethane sulfonate, and 0.06 g of triphenylsulfonium triflate. The resulting solution was filtered through 0.20 μm filter to obtain a photoresist composition.

Figure 5:
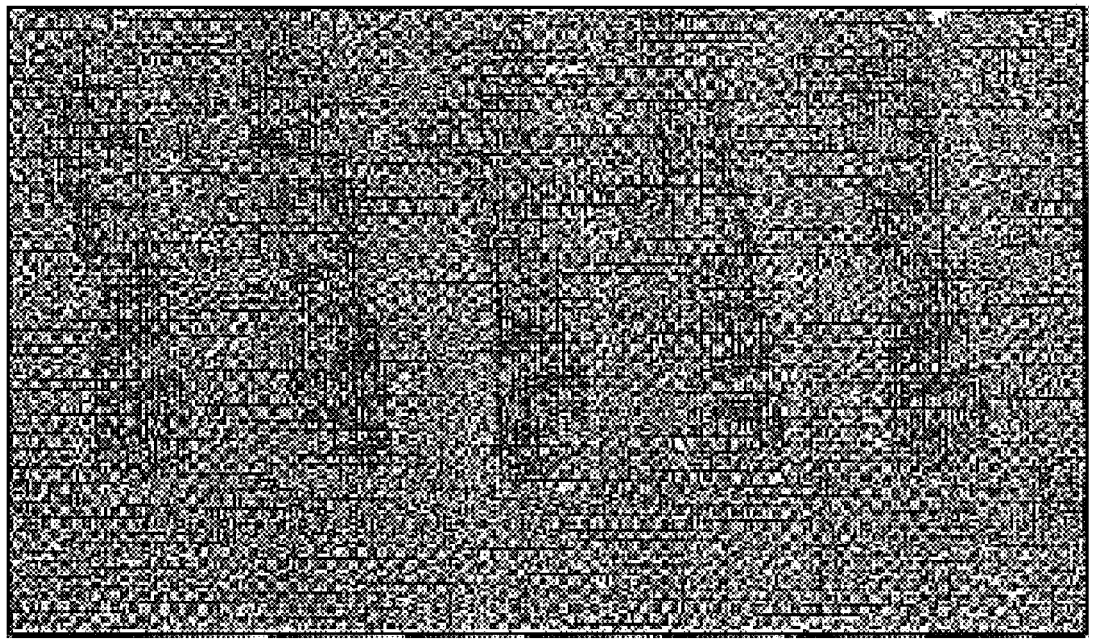
FIG. 5 is a photograph showing a pattern obtained in Example 13.

The photoresist composition thus prepared was spin-coated on silicon wafer to form a photoresist film, and soft-baked in an oven or hot plate of about 110° C. for about 90 seconds. After baking, the photoresist was exposed to light using a ArF laser exposer, and then post-baked at about 110° C. for about 90 seconds. When the post-baking was completed, it was developed in 2.38 wt % aqueous TMAH solution for about 40 seconds, to obtain 0.12 μm L/S pattern (see FIG. 5).

EXAMPLE 14

To 100 g of propylene glycol methyl ethyl acetate (PGMEA) was added 10 g of the polymer of Example 6, 0.06 g of phthalimidotrifluoromethane sulfonate, and 0.06 g of triphenylsulfonium triflate. The resulting solution was filtered through 0.20 μm filter to obtain a photoresist composition.

Figure 6:
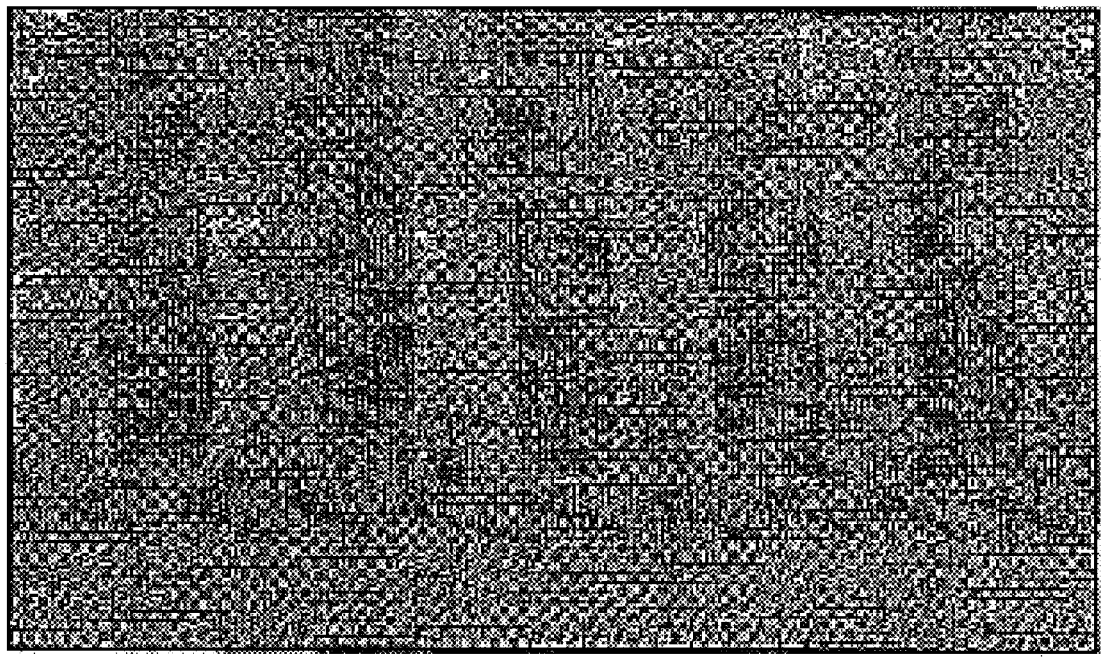
FIG. 6 is a photograph showing a pattern obtained in Example 14.

The photoresist composition thus prepared was spin-coated on silicon wafer to form a photoresist film, and soft-baked in an oven or hot plate of about 110° C. for about 90 seconds. After baking, the photoresist was exposed to light using a ArF laser exposer, and then post-baked at about 110° C. for about 90 seconds. When the post-baking was completed, it was developed in 2.38 wt % aqueous TMAH solution for about 40 seconds, to obtain 0.12 μm L/S pattern (see FIG. 6).

EXAMPLE 15

To 100 g of propylene glycol methyl ethyl acetate (PGMEA) was added 10 g of the polymer of Example 7, 0.06 g of phthalimidotrifluoromethane sulfonate, and 0.06 g of triphenylsulfonium triflate. The resulting solution was filtered through 0.20 μm filter to obtain a photoresist composition.

Figure 7:
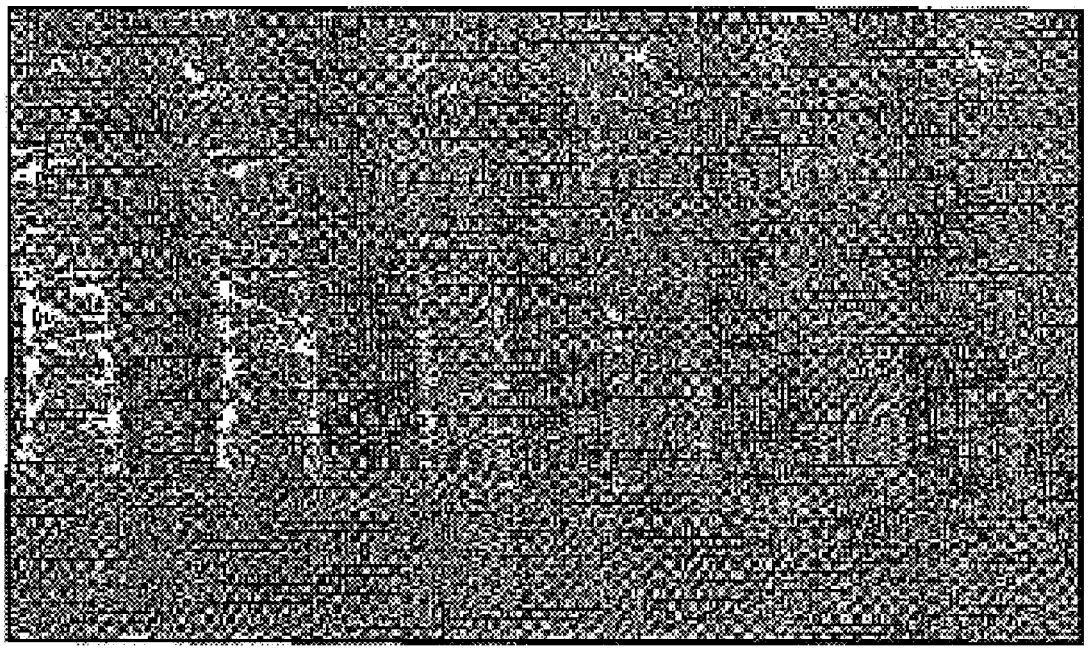
FIG. 7 is a photograph showing a pattern obtained in Example 15.

The photoresist composition thus prepared was spin-coated on silicon wafer to form a photoresist film, and soft-baked in an oven or hot plate of about 110° C. for about 90 seconds. After baking, the photoresist was exposed to light using a ArF laser exposer, and then post-baked at about 110° C. for about 90 seconds. When the post-baking was completed, it was developed in 2.38 wt % aqueous TMAH solution for about 40 seconds, to obtain 0.12 μm L/S pattern (see FIG. 7).

EXAMPLE 16

To 100 g of propylene glycol methyl ethyl acetate (PGMEA) was added 10 g of the polymer of Example 8, 0.06 g of phthalimidotrifluoromethane sulfonate, and 0.06 of triphenylsulfonium triflate. The resulting solution was filtered through 0.20 μm filter to obtain a photoresist composition.

Figure 8:
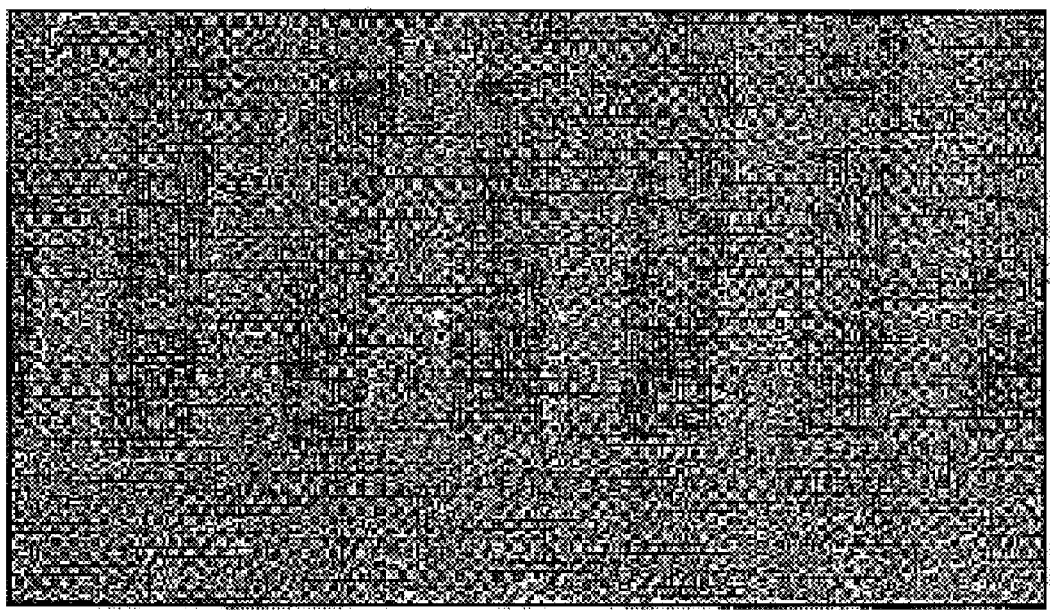
FIG. 8 is a photograph showing a pattern obtained in Example 16.

The photoresist composition thus prepared was spin-coated on silicon wafer to form a photoresist film, and soft-baked in an oven or hot plate of about 110° C. for about 90 seconds. After baking, the photoresist was exposed to light using a ArF laser exposer, and then post-baked at about 110° C. for about 90 seconds. When the post-baking was completed, it was developed in 2.38 wt % aqueous TMAH solution for about 40 seconds, to obtain 0.12 μm L/S pattern (see FIG. 8).

As discussed earlier, the photoresist pattern using the photoresist compositions of the present invention can be formed with excellent durability, etching resistance, reproducibility and resolution. In addition, the photoresist compositions can be used to form an ultrafine pattern of DRAM over 4 G and 16 G as well as DRAM below 1 G. Moreover, the photoresist polymer comprising fluorine has high light transmittance at a low wavelength of light source, and thus is suitable for ArF, KrF, VUV, EUV or E-beam.

What is claimed:
1. A photoresist polymer comprising the monomers of following Formula 1 and Formula 2 and at least one monomer selected from the group consisting of following Formula 3 and Formula 4:

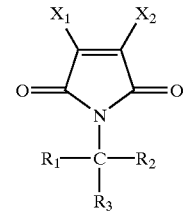

Formula 1

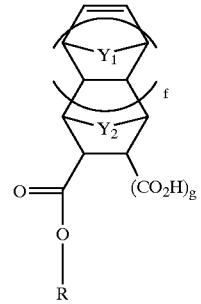

Formula 2

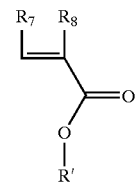

Formula 3

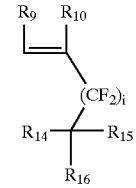

Formula 4 wherein, $X_1$ and $X_2$ are individually selected from the group consisting of H, $CF_3$ and halogen; $R_1$, $R_2$ and $R_3$ are individually selected from the group consisting of H, F, $CF_3$, OH, ($C_1$–$C_{10}$) alkyl group, ($C_1$–$C_{10}$) perfluoroalkyl group and ($C_1$–$C_{10}$) alkoxy group; R' is an acid labile protecting group or

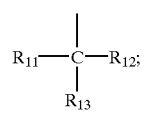

$R_{11}$, $R_{12}$ and $R_{13}$ are individually selected from the group consisting of H, F, $CF_3$, OH, ($C_1$–$C_{10}$) alkyl group, ($C_1$–$C_{10}$) perfluoroalkyl group and ($C_1$–$C_{10}$) alkoxy group; $R_7$, $R_8$, $R_9$ and $R_{10}$ are selected from the group consisting of H, F, $CF_3$ and $CH_3$; $R_{14}$, $R_{15}$ and $R_{16}$ are selected from the group consisting of H, F, CF$_3$, (C$_1$–C$_{10}$) alkyl group, (C$_1$–C$_{10}$) perfluoroalkyl group and (C$_1$–C$_{10}$) alkoxy group, wherein, at least one of R$_{14}$, R$_{15}$ and R$_{16}$ are F, CF$_3$ or (C$_1$–C$_{10}$) perfluoroalkyl group; wherein, Y$_2$ and Y$_2$ are individually selected from the group consisting of O, CH$_2$ and CH$_2$CH$_2$; R is an acid labile protecting group or

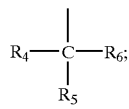

R$_4$, R$_5$ and R$_6$ are individually selected from the group consisting of H, F, CF$_3$, OH, (C$_1$–C$_{10}$) alkyl group, (C$_1$–C$_{10}$) perfluoroalkyl group and (C$_1$–C$_{10}$) alkoxy group; i is an integer from 0 to 10; and f and q are 0 or 1.

2. The photoresist polymer according to claim 1, wherein the acid labile protecting group is selected from the group consisting of t-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, t-butoxyethyl, 1-isobutoxyethyl and 2-acetylmenth-1-yl.

3. The photoresist polymer according to claim 1, further comprising the co-monomer of following Formula 5:

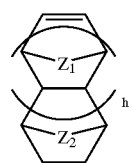

Formula 5 wherein, Z$_1$ and Z$_2$ are individually selected from the group consisting of O, CH$_2$ and CH$_2$CH$_2$; and h is 0 or 1.

4. The photoresist polymer according to claim 1, wherein the compound of Formula 1 is N-perfluoropropyl maleimide or N-perfluorooctyl maleimide.

5. A photoresist polymer comprising a repeating unit of the following Formula 6:

wherein, X$_1$ and X$_2$ are individually selected from the group consisting of H, CF$_3$ and halogen; Y$_1$, Y$_2$, Z$_1$ and Z$_2$ are individually selected from the group consisting of O, CH$_2$ and CH$_2$CH$_2$; R$_1$, R$_2$ and R$_3$ are individually selected from the group consisting of H, F, CF$_3$, OH, (C$_1$–C$_{10}$) alkyl group, (C$_1$–C$_{10}$) perfluoroalkyl group and (C$_1$–C$_{10}$) alkoxy group; R is an acid labile protecting group or

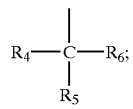

R' is an acid labile protecting group or

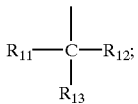

R$_4$, R$_5$, R$_6$, R$_{11}$, R$_{12}$ and R$_{13}$ are individually selected from the group consisting of H, F, CF$_3$, OH, (C$_1$–C$_{10}$) alkyl group, (C$_1$–C$_{10}$) perfluoroalkyl group and (C$_1$–C$_{10}$) alkoxy group; R$_7$, R$_8$, R$_9$ and R$_{10}$ individually represent H, F, CF$_3$ or CH$_3$; R$_{14}$, R$_{15}$ and R$_{16}$ are individually selected from the group consisting of H, F, CF$_3$, OH, (C$_1$–C$_{10}$) alkyl group, (C$_1$–C$_{10}$) perfluoroalkyl group and (C$_1$–C$_{10}$) alkoxy group, wherein, at least one of R$_{14}$, R$_{15}$ and R$_{16}$ are F, CF$_3$ and (C$_1$–C$_{10}$) perfluoroalkyl group; f and g are 0 or 1; i is an integer from 0 to 10; and the ratio a:b:c:d:e has the falls within the ranges, present between 0 and 50 mol %:40–60 mol %:0–30 mol %:0–30 mol %:0–50 mol % wherein d and e are not 0 mol % at the same time.

6. The photoresist polymer according to claim 5, wherein the repeating unit is selected from the group consisting of:

poly[N-perfluoropropyl maleimide/t-butyl-5-norbornene-2-carboxylate/2-(Perfluorooctyl)ethyl methacrylate);
poly(N-perfluoropropyl maleimide/t-butyl-5-norbornene-2-carboxylate/2,2,4,4,5,5,6,6,6-nonafluorohexyl methacrylate);
poly(N-perfluorooctyl maleimide/t-butyl-5-norbornene-2-carboxylate/3,3,4,4,5,5,6,6,6-nonafluoro-1-hexene); and Formula 6

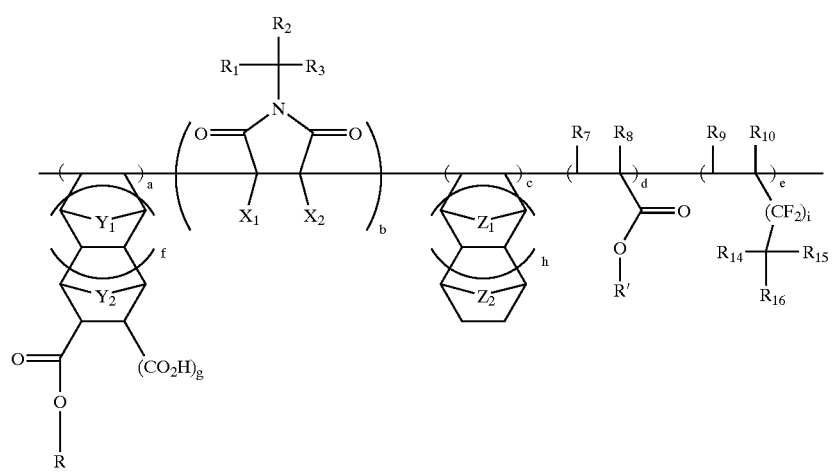

poly(N-perfluorooctyl maleimide/norbornylene/t-butyl-5-norbornene-2-carboxylate/4,4,5,5,6,6,7,7,7-nonafluoro-2-hydroxyheptyl acrylate).

7. A process for preparing a photoresist polymer comprising:

(a) admixing (i) a compound of Formula 1, (ii) a compound of Formula 2 (iii) at least one compound selected from the group consisting of Formula 3 and Formula 4, and (iii) (iv) optionally a compound of Formula 2 and Formula 5; and (b) adding a polymerization initiator into the resultant solution to obtain a repeating unit of Formula 6:

Formula 1

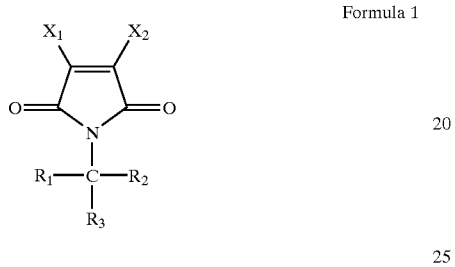

Formula 2

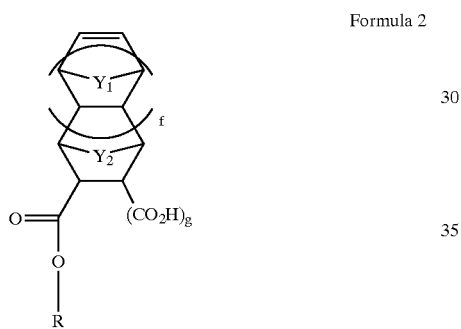

Formula 3

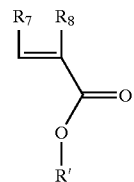

Formula 4

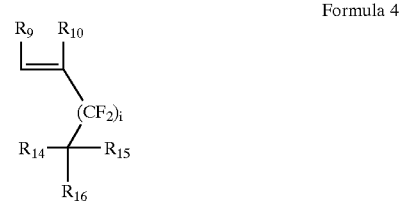

Formula 5

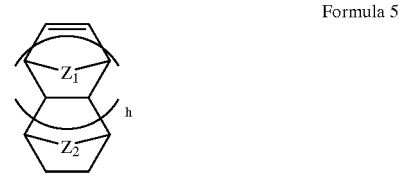

Formula 6

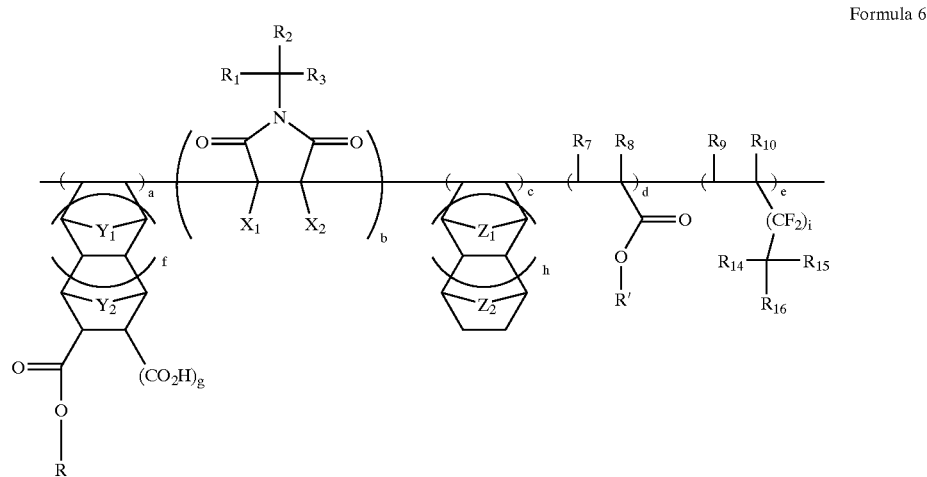

wherein, $X_1$ and $X_2$ are individually selected from the group consisting of H, $CF_3$ and halogen; $Y_1$, $Y_2$, $Z_1$ and $Z_2$ are individually selected from the group consisting of O, $CH_2$ and $CH_2CH_2$; $R_1$, $R_2$ and $R_3$ are individually selected from the group consisting of H, F, $CF_3$, OH, ($C_1$–$C_{10}$) alkyl, ($C_1$–$C_{10}$) perfluoroalkyl group and ($C_1$–$C_{10}$) alkoxy group; R is an acid labile protecting group or

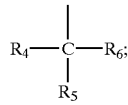

R' is an acid labile protecting group or

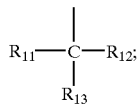

$R_4$, $R_5$, $R_6$, $R_{11}$, $R_{12}$ and $R_{13}$ are individually selected from the group consisting of H, F, $CF_3$, OH, ($C_1$–$C_{10}$) alkyl, ($C_1$–$C_{10}$) perfluoroalkyl group and ($C_1$–$C_{10}$) alkoxy group; $R_7$, $R_8$, $R_9$ and $R_{10}$ individually represent H, F, $CF_3$ or $CH_3$; $R_{14}$, $R_{15}$ and $R_{16}$ are individually selected from the group consisting of H, F, $CF_3$, OH, ($C_1$–$C_{10}$) alkyl, ($C_1$–$C_{10}$) perfluoroalkyl group and ($C_1$–$C_{10}$) alkoxy group, wherein, at least one of $R_{14}$, $R_{15}$ and $R_{16}$ are F, $CF_3$ and ($C_1$–$C_{10}$) perfluoroalkyl group; f and g are 0 or 1; i is an integer ranging from 0 to 10; and the ratio a:b:c:d:e falls within the ranges present in an amount between 0 and 50 mol %:40–60 mol %:0–30 mol %:0–30 mol %:0–50 mol % wherein d and e are not zero at the same time.

8. A process for preparing a photoresist polymer according to claim 7, wherein the step (a) is carried out in a polymerization solvent selected from the group consisting of cyclohexanone, cyclopentanone, tetrahydrofuran, dimethylformamide, dimethylsulfoxide, dioxane, methyl ethyl ketone, benzene, toluene, propylene glycol methyl ether acetate, xylene and mixtures thereof.

9. A process for preparing a photoresist polymer according to claim 7, wherein the polymerization initiator is selected from the group consisting of benzoylperoxide, 2,2'-azobisisobutylronitrile(AIBN), acetylperoxide, laurylperoxide, t-butylacetate, t-butyl hydroperoxide and tert-butylperoxide.

10. A photoresist composition comprising:
(i) the photoresist polymer of claim 1;
(ii) an organic solvent; and
(iii) a photoacid generator.

11. The photoresist composition according to claim 10, wherein the photoacid generator is selected from the group consisting of phthalimidotrifluoromethane sulfonate, dinitrobenzyl tosylate, n-decyl disulfone and naphthyl imidotrifluoro methanesulfonate.

12. The photoresist composition according to claim 11, wherein the photoacid generator further comprises one or more compound(s) selected from the group consisting of diphenyl iodide hexafluorophosphate, diphenyliodide hexafluoroarsenate, diphenyliodide hexafluoroantimonate, diphenyl-p-methoxyphenylsulfonium triflate, diphenyl-p-toluenylsulfonium triflate, diphenyl-p-isobutylphenylsulfonium triflate, triphenylsulfonium hexafluoroarsenate, triphenylsulfonium hexafluoroantimonate, triphenylsulfonium triflate and dibutylnaphthylsulfonium triflate.

13. The photoresist composition according to claim 10, wherein the photoacid generator is used in an amount ranging from 0.05 to about 10% by weight of the photoresist polymer.

14. The photoresist composition according to claim 10, wherein the organic solvent is selected from the group consisting of methyl 3-methoxypropionate, ethyl 3-ethoxypropionate, propyleneglycol methyl ether acetate, cyclohexanone, 2-heptanone, ethyl lactate, diethyleneglycol diethyl ether and mixtures thereof.

15. The photoresist composition according to claim 10, wherein the organic solvent is used in an amount ranging from about 500 to about 2000% by weight of said photoresist polymer.

16. A process for formation of a photoresist pattern comprising:
(a) coating the photoresist composition of claim 10 on a substrate to form a photoresist film;
(b) exposing the photoresist film to light; and
(c) developing the photoresist film.

17. The process according to claim 16, further comprising a soft baking step before step (b) and/or a post baking step after step (b).

18. The process according to claim 17, wherein the soft and post baking steps are performed at the temperature ranging from about 70 to about 200° C.

19. The process according to claim 16, wherein the source of light is selected from the group consisting of ArF, KrF, VUV, EUV, E-beam, X-line and ion beam.

20. The process according to claim 16, wherein said photoresist film is irradiated with light-exposure energy ranging from about 1 to about 100 mJ/cm$^2$.

21. A semiconductor element manufactured according to the process of claim 16.

* * * * *

UNITED STATES PATENT AND TRADEMARK OFFICE
CERTIFICATE OF CORRECTION

PATENT NO. : 6,858,371 B2
DATED : February 22, 2005
INVENTOR(S) : Geun Su Lee et al.

It is certified that error appears in the above-identified patent and that said Letters Patent is hereby corrected as shown below:

Column 13,
Line 4, after "wherein," please delete "$Y_2$ and $Y_2$" and insert -- $Y_1$ and $Y_2$ -- in its place.
Line 17, after "integer from 0 to 10; and" please delete "f and q" and insert -- f and g -- in its place.

Signed and Sealed this

Ninth Day of August, 2005

JON W. DUDAS
*Director of the United States Patent and Trademark Office*